United States Patent
Tsai et al.

(10) Patent No.: US 9,906,134 B1
(45) Date of Patent: Feb. 27, 2018

(54) INSULATION DETECTING CIRCUIT, POWER CONVERTING DEVICE AND INSULATION IMPEDANCE VALUE DETECTING METHOD

(71) Applicant: DELTA ELECTRONICS, INC., Taoyuan (TW)

(72) Inventors: Tsung-Han Tsai, Taoyuan (TW); Po-Jen Hou, Taoyuan (TW); Xin-Hung Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/628,631

(22) Filed: Jun. 20, 2017

(30) Foreign Application Priority Data

Aug. 4, 2016 (TW) .............................. 105124722 A

(51) Int. Cl.
| | |
|---|---|
| H02M 3/158 | (2006.01) |
| H02M 1/42 | (2007.01) |
| H02H 1/00 | (2006.01) |
| H02J 3/38 | (2006.01) |
| G05D 9/12 | (2006.01) |
| H02M 7/40 | (2006.01) |
| H02J 9/06 | (2006.01) |

(52) U.S. Cl.
CPC .............. *H02M 3/158* (2013.01); *G05D 9/12* (2013.01); *H02H 1/0046* (2013.01); *H02J 3/387* (2013.01); *H02J 9/061* (2013.01); *H02M 1/4208* (2013.01); *H02M 7/40* (2013.01)

(58) Field of Classification Search
CPC ...... H02M 3/158; H02M 1/4208; H02M 7/40; H02H 1/0046; H02J 9/061; G05D 9/12
See application file for complete search history.

(56) References Cited

U.S. PATENT DOCUMENTS

| | | | |
|---|---|---|---|
| 8,773,156 B2 | 7/2014 | Takada et al. | |
| 9,069,025 B2 * | 6/2015 | Schaefer | .............. G01R 27/025 |

(Continued)

FOREIGN PATENT DOCUMENTS

| | | |
|---|---|---|
| CN | 102520254 B | 9/2013 |
| CN | 103630745 A | 3/2014 |
| CN | 104569607 A | 4/2015 |

OTHER PUBLICATIONS

The pertinent parts of US20120119755A1.

*Primary Examiner* — Emily P Pham
(74) *Attorney, Agent, or Firm* — CKC & Partners Co., Ltd.

(57) ABSTRACT

An insulation detecting circuit includes a first switching unit, a second switching unit, a detecting resistor, a processing unit, and a voltage detecting unit. The second switching unit is electrically coupled to the first switching unit. The processing unit is configured to control the first and the second switching units. The voltage detecting unit obtains a first voltage value across the detecting resistor when the processing unit controls the first switching unit to be on and the second switching unit to be off. The voltage detecting unit obtains a second voltage value across the detecting resistor when the processing unit controls the first switching unit to be off and the second switching unit to be on. The processing unit operates in a first mode and configured to calculate an insulation impedance value of a power converting device according to the first and the second voltage values.

20 Claims, 10 Drawing Sheets

(56) References Cited

U.S. PATENT DOCUMENTS

| | | | |
|---|---|---|---|
| 9,132,733 B2* | 9/2015 | Tago | B60L 3/0069 |
| 2012/0119755 A1 | 5/2012 | Ishii et al. | |
| 2012/0223734 A1* | 9/2012 | Takada | H02S 50/10 |
| | | | 324/761.01 |
| 2013/0268216 A1* | 10/2013 | Dalban Pilon | G01R 31/08 |
| | | | 702/58 |
| 2015/0084654 A1* | 3/2015 | Mueller | G01R 31/42 |
| | | | 324/713 |
| 2015/0333646 A1* | 11/2015 | Choi | H02M 5/44 |
| | | | 363/35 |
| 2017/0141569 A1* | 5/2017 | Liu | H02J 1/00 |

* cited by examiner

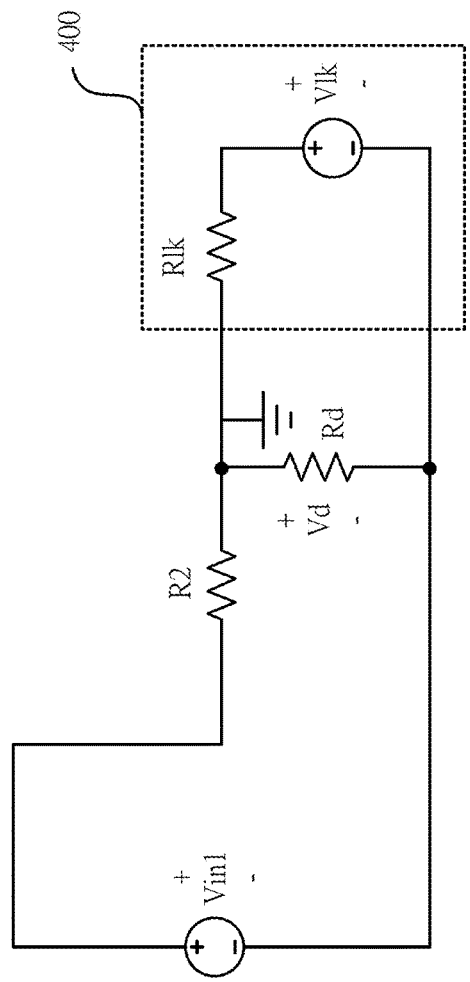
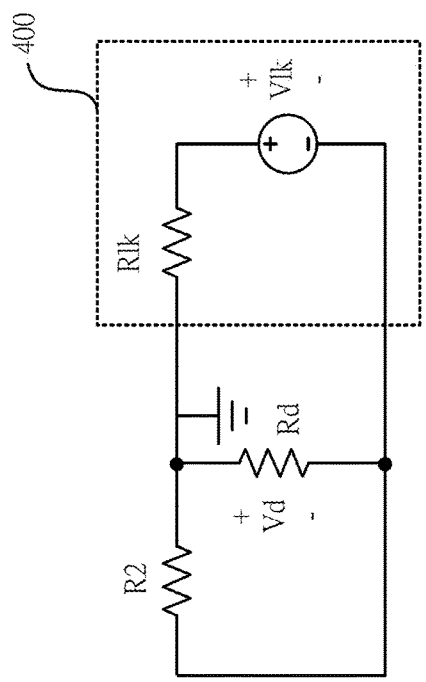
Fig. 3B
Fig. 3A

INSULATION DETECTING CIRCUIT, POWER CONVERTING DEVICE AND INSULATION IMPEDANCE VALUE DETECTING METHOD

RELATED APPLICATIONS

This application claims priority to Taiwan Application Serial Number 105124722, filed Aug. 4, 2016, which is herein incorporated by reference.

BACKGROUND

Technical Field

The present disclosure relates to a power converter, and in particular, to a power converter which is able to detect an insulation impedance value.

Description of Related Art

In the solar power generating system nowadays, in order to be synchronized with the grid, power converting devices are required to convert the DC power output by the solar PV module to AC power.

However, if the grounding failure occurs in the power converting device, leakage current may be generated and results in the device failure or the occurrence of an accident. Therefore, a ground impedance detecting function is needed for the power converting device to guarantee the normal operation of the device.

SUMMARY

According to one aspect of the present disclosure, an insulation detecting circuit is provided which includes a first switching unit, a second switching unit electrically coupled to the first switching unit, a detecting resistor, a processing unit configured to control the first switching unit and the second switching unit, and a voltage detecting unit configured to obtain a first voltage value across the detecting resistor when the processing unit controls the first switching unit to be on and the second switching unit to be off. The voltage detecting unit is further configured to obtain a second voltage value across the detecting resistor when the processing unit controls the first switching unit to be off and the second switching unit to be on. The processing unit is further configured to operate in a first mode and calculate an insulation impedance value of a power converting device according to the first voltage value and the second voltage value.

According to another aspect of the disclosure, a power converting device is provided which includes a dc-dc converting circuit configured to convert a dc input voltage to a dc bus voltage, a dc-ac converting circuit electrically coupled to the dc-dc converting circuit and configured to convert the dc bus voltage to an ac voltage, and an insulation detecting circuit electrically coupled to the dc-dc converting circuit. The insulation detecting circuit includes a first switching unit, a second switching unit electrically coupled to the first switching unit, a detecting resistor, a processing unit configured to control the first switching unit and the second switching unit, and a voltage detecting unit configured to obtain a first voltage value across the detecting resistor when the processing unit controls the first switching unit to be on and the second switching unit to be off. The voltage detecting unit is further configured to obtain a second voltage value across the detecting resistor when the processing unit controls the first switching unit to be off and the second switching unit to be on. The processing unit is further configured to operate in a first mode and calculate an insulation impedance value of the power converting device according to the first voltage value and the second voltage value.

According to another aspect of the disclosure, an insulation impedance value detecting method is provided which includes: in a first mode, controlling, by a processing unit, a first switching unit to be on and a second switching unit to be off; detecting, by a voltage detecting unit, a first voltage value across a detecting resistor; controlling, by the processing unit, the first switching unit to be off and the second switching unit to be on; detecting, by the voltage detecting unit, a second voltage value across the detecting resistor; and calculating, by the processing unit, an insulation impedance value of a power converting device according to the first voltage value and the second voltage value.

BRIEF DESCRIPTION OF THE DRAWINGS

The disclosure can be more fully understood by reading the following detailed description of the embodiments, with reference made to the accompanying drawings as follows:

FIG. 3A and FIG. 3B are diagrams illustrating an insulation detecting circuit in operation in a first mode according to some embodiments of the present disclosure.

DETAILED DESCRIPTION

Figure 1:
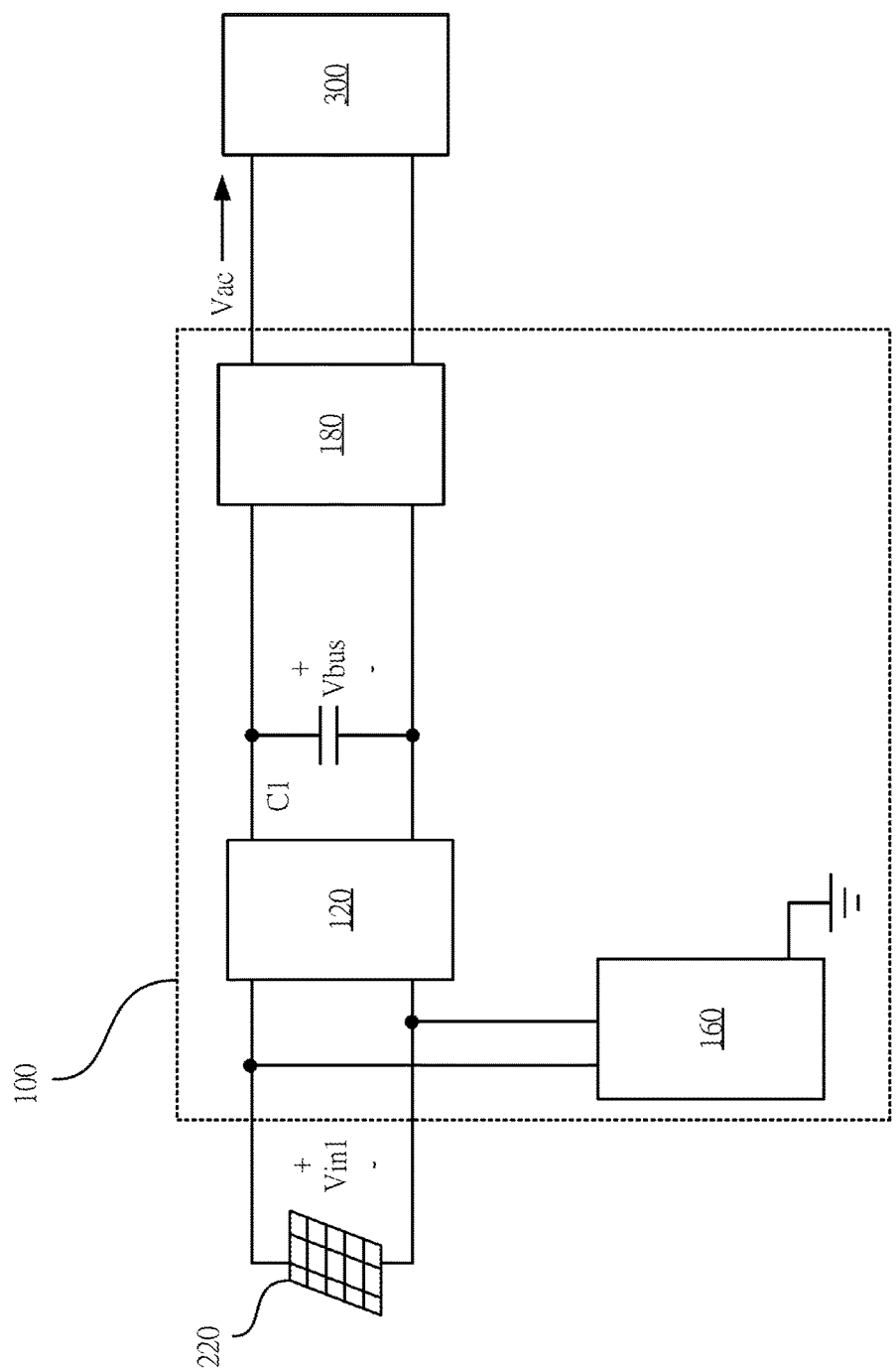
FIG. 1 is a diagram illustrating a power converting device according to some embodiments of the present disclosure.

The embodiments herein described are by examples, and are not intended to be limiting. Alternatives, modifications and equivalents may be included within the spirit and scope of the disclosure as defined by the appended claims. Drawings are not drawn to scale and not meant to limit the actual embodiments of the present disclosure. Wherever possible, same reference numbers are used in the drawings and the description to refer to the same or like parts for better understanding. While method steps are disclosed herein as a series of acts or events, some may occur in different orders and/or concurrently with other acts or events apart from those described herein. The term "coupled" and "connected" may be used to indicate that two or more elements cooperate or interact with each other, and may also be termed electrically coupled/connected. The terms "first," "second," etc., are used to distinguish one element from another.

Reference is made to FIG. 1. A power converting device 100 may be applied in a solar power generating system to convert a DC power output from solar PV panels to AC power. An input terminal of the power converting device 100 is electrically coupled to solar PV power generating modules 220, and is configured to receive a DC input voltage Vin1 provided by the solar PV power generating modules 220. The power converting device 100 converts the DC input voltage Vin1 to an AC voltage Vac. For example, in some embodiments, the AC voltage Vac output by the power converting device 100 may be synchronized to a grid 300 to supply power to the grid 300. In addition, in some embodiments, the AC voltage Vac output by the power converting device 100 may also supply power directly to local loads with energy storage devices.

The power converting device 100 includes a dc-dc converting circuit 120, an insulation detecting circuit 160, a dc-ac converting circuit 180 and a capacitor unit C1. The output terminal of the dc-dc converting circuit 120 is electrically coupled to the capacitor unit C1. The dc-ac converting circuit 180 is electrically coupled to the dc-dc converting circuit 120. The insulation detecting circuit 160 is electrically coupled to the input side of the dc-dc converting circuit 120 and configured to receive the DC input voltage Vin1.

It is noted that, for convenience of explanation, only one solar PV power generating module 220 and the corresponding dc-dc converting circuit 120 and the insulation detecting circuit 160 are illustrated in FIG. 1, but the present disclosure is not limited thereto. Specifically, in some embodiments, the solar PV power generating system may include two or more PV power generating modules 220. For each of the solar PV power generating modules 220, the power converting device 100 includes a corresponding dc-dc converting circuit 120 and a corresponding insulation detecting circuit 160.

In some embodiments, the dc-dc converting circuit 120 is configured to convert the dc input voltage Vin1 provided by the solar PV power generating module 220 to the dc bus voltage Vbus. For example, the dc-dc converting circuit 120 may include a boost converter or a buck-boost converter in order to boost the dc input voltage Vin1. Alternatively stated, in some embodiments, the voltage level of the dc bus voltage Vbus is higher than or equal to the voltage level of the dc input voltage Vin1. Specifically, when the dc input voltage Vin1 is low, the dc-dc converting circuit 120 performs a boost operation, and the voltage level of the dc bus voltage Vbus is higher than the voltage level of the dc input voltage Vin1. In some situations, when the solar PV power generating module 220 supplies sufficient power and the dc input voltage Vin1 exceeds the preset voltage level of the dc bus voltage Vbus, the dc-dc converting circuit 120 does not perform additional boost conversion. In this case, the voltage level of the dc bus voltage Vbus is equal to the voltage level of the dc input voltage Vin1.

In addition, when the solar radiation condition changes or partial shielding occurs, the corresponding dc-dc converting circuit 120 may control the solar PV power generating module 220 to operate at a different power operating point in order to obtain the maximum power output, so as to realize maximum power point tracking (MPPT). In some embodiments, the power converting device 100 is configured so that the output terminal of the dc-dc converting circuit 120 is electrically coupled to the capacitor unit C1 to output the dc bus voltage Vbus to the dc-ac converting circuit 180, such that the solar PV power generating module 220 may be operated with maximum efficiency to increase the overall power generation efficiency of the system.

As shown in FIG. 1, a first terminal of the capacitor unit C1 is electrically coupled to the positive power line, and a second terminal of the capacitor unit C1 is electrically coupled to the negative power line. Thus, the dc bus voltage Vbus stored by the capacitor unit C1 may be provided via the positive power line and the negative power line from the dc-dc converting circuit 120 to the dc-ac converting circuit 180.

Therefore, the dc-ac converting circuit 180 may convert the dc bus voltage Vbus to the ac voltage Vac, and may output the ac voltage Vac to the grid 300 or provide the ac voltage Vac to a local load.

In some embodiments, the insulation detecting circuit 160 arranged at the input side of the dc-dc converting circuit 120 may receive the DC input voltage Vin1 from the input terminal of the dc-dc converting circuit 120, and detect an insulation impedance value of the power converting device 100 according to the DC input voltage Vin1.

Figure 2:
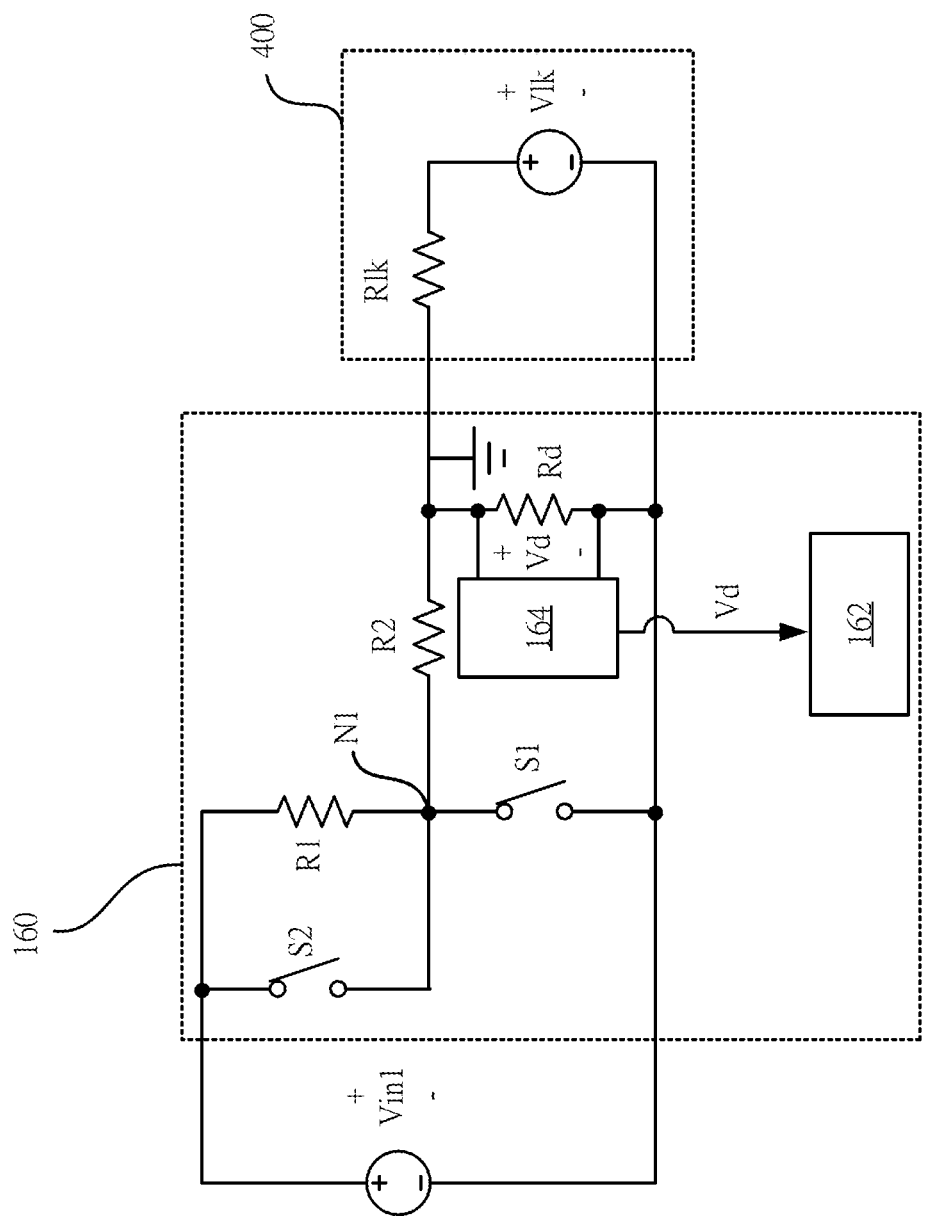
FIG. 2 is a diagram illustrating an insulation detecting circuit according to some embodiments of the present disclosure.

Referring to FIG. 2, in some embodiments, the insulation detecting circuit 160 includes a processing unit 162, a voltage detecting unit 164, resistors R1, R2, a detecting resistor Rd, and switching units S1, S2. A first terminal of the resistor R1 is electrically coupled to a first terminal of the switching unit S2 and a positive terminal of the DC input voltage Vin1. A second terminal of the resistor R1 is electrically coupled to a second terminal of the switching unit S2 at a node N1. Alternatively stated, the resistor R1 and the switching unit S2 are electrically coupled to each other in parallel.

A first terminal of the switching unit S1 is electrically coupled to the second terminal of the resistor R1 and the second terminal of the switching unit S2 at the node N1. A second terminal of the switching unit S1 is electrically coupled to a negative terminal of the DC input voltage Vin1.

A first terminal of the resistor R2 is electrically coupled to the second terminal of the resistor R1 and the first terminal of the switching units S1, and the second terminal of the S2, at the node N1. A second terminal of the resistor R2 is electrically coupled to a ground terminal. The detecting resistor Rd is electrically coupled between the ground terminal and the negative terminal of the DC input voltage Vin1.

Generally, during normal operation, the ground impedance value of the power converting device 100 is considerably large. When a foreign object 400 causes an insulation failure of the power converting device 100, as shown in FIG. 2, the foreign object 400 has a leakage voltage Vlk and a leakage resistance Rlk to the ground, in which the leakage voltage Vlk denotes the voltage of the location where the foreign object 400 contacts the device. If the impedance value of the leakage resistance Rlk can be detected, the insulation impedance value of the power converting device 100 at the time may be known.

In some embodiments, the processing unit 162 is configured to control the switching units S1 and S2 to be on or off and calculate the insulation impedance value according to the cross voltage Vd of the detecting resistor Rd. Specifically, in a first mode, the processing unit 162 controls the switching unit S1 to be on and the switching unit S2 to be off, and obtains a first voltage value (i.e., the cross voltage Vd when the switching unit S1 is on and the switching unit S2 is off) across the detecting resistor Rd by the voltage detecting unit 164. Next, the processing unit 162 controls the switching unit S1 to be off and the switching unit S2 to be on, and obtains a second voltage value (i.e., the cross voltage Vd when the switching unit S1 is off and the switching unit S2 is on) across the detecting resistor Rd by the voltage detecting unit 164. Accordingly, the processing unit 162 may calculate the insulation impedance value according to the first voltage value and the second voltage value obtained.

Specifically, the voltage detecting unit 164 may include various voltage or current sensing elements to achieve the detection of the cross voltage Vd of the detecting resistor Rd. Those skilled in the art can understand how to achieve the voltage detection stated above and thus further details are not further elaborated herein for the sake of brevity.

Referring to FIG. 3A together with FIG. 2, when the switching unit 51 is on and the switching unit S2 is off, the resistor R2 and the detecting resistor Rd are coupled to each other in parallel. At this time, based on the circuit shown in FIG. 3A, the processing unit 162 may obtain an equation of the unknown leakage voltage Vlk and the leakage resistance Rlk to ground according to the cross voltage Vd (i.e., the first voltage value) of the detecting resistor Rd.

Referring to FIG. 3B together with FIG. 2, when the switching unit 51 is off and the switching unit S2 is on, the first terminal of the resistor R2 is electrically coupled to the positive terminal of the DC input voltage Vin1, the second terminal of the resistor R2 is electrically coupled to the first terminal of the detecting resistor Rd, and the second terminal of the detecting resistor Rd is electrically coupled to the negative terminal of the DC input voltage Vin1. Based on the circuit shown in FIG. 3B, the processing unit 162 may obtain another equation of the unknown leakage voltage Vlk and the leakage resistance Rlk to ground according to the cross voltage Vd (i.e., the second voltage value) of the detecting resistor Rd.

Since the parameters of the resistors R1, R2 and the detecting resistor Rd are already known, and the DC input voltage Vin1 may be obtained by voltage detecting elements, the processing unit 162 may perform calculations using two equations to solve the unknown leakage voltage Vlk and the leakage resistor Rlk. Therefore, the insulation detecting circuit 160 may detect the insulation impedance value by the operation of turning on/off the switching units S1 and S2.

It is noted that, as shown in FIG. 3B, in the first mode, the resistor R1 is bypassed since the switching unit S1 is off and the switching unit S2 is on. Thus, the cross voltage Vd of the detecting resistor Rd is determined by the DC input voltage Vin1, the resistor R2, and the leakage voltage Vlk and the leakage resistor Rlk of the foreign object 400. Therefore, the detected cross voltage Vd (e.g., the second voltage value) of the detecting resistor Rd at the time is relatively large compared to the cross voltage Vd of the detecting resistor Rd when the switching units S1 and S2 are both off.

Accordingly, by turning on the switching unit S2 to bypass the resistor R1 when the switching unit S1 is off, the voltage level sensed by the processing unit 162 may be increased. Thus, the voltage difference between the first voltage value and the second voltage value is relatively large and the accuracy of the insulation detection may be increased correspondingly, so as to avoid the detection failure due to the voltage fluctuation or the signal error.

By the aforementioned operation, the insulation detecting circuit 160 may detect and calculate the insulation impedance value of the power converting device 100. In addition, in some embodiments, the insulation detecting circuit 160 may further be configured to output a warning signal when the insulation impedance value is smaller than a predetermined safety limit value. For example, the insulation detecting circuit 160 may notify the user of the abnormal insulation impedance value via the warning signal, or stop the operation of the power converting device 100 by the warning signal so as to prevent device damage or prevent an accident from occurring.

Furthermore, in some embodiments, the insulation detecting circuit 160 illustrated in FIG. 2 may further be operated in a second mode different from the first mode to achieve the insulation detection. Specifically, in the second mode, the processing unit 162 controls the switching unit 51 to be on and the switching unit S2 to be off, and obtains the first voltage value (i.e., the cross voltage Vd when the switching unit 51 is on and the switching unit S2 is off) across the detecting resistor Rd by the voltage detecting unit 164. Further, the processing unit 162 controls the switching unit 51 and the switching unit S2 to be off at the same time, and obtains a third voltage value (i.e., the cross voltage Vd when the switching unit 51 and the switching unit S2 are both off) across the detecting resistor Rd by the voltage detecting unit 164. Accordingly, the processing unit 162 may calculate the insulation impedance value according to the first voltage value and the third voltage value obtained.

Figure 4B:
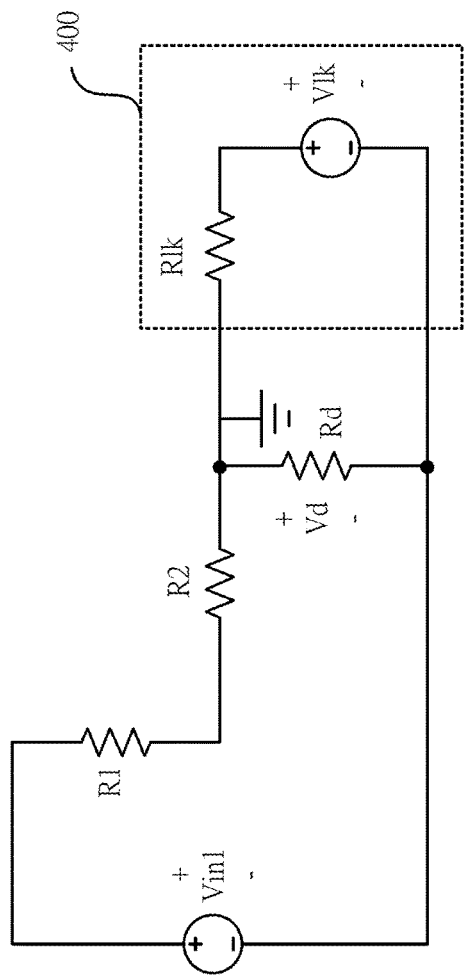
FIG. 4A and FIG. 4B are diagrams illustrating an insulation detecting circuit in operation in a second mode according to some embodiments of the present disclosure.
Figure 4A:
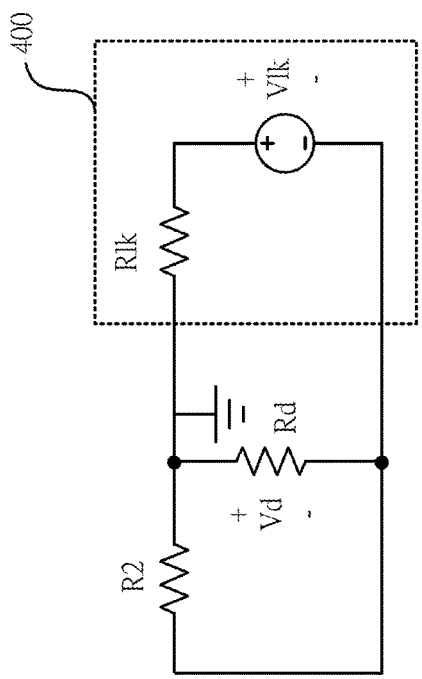

Referring to FIG. 4A together with FIG. 2, when the switching unit 51 is on and the switching unit S2 is off, the resistor R2 and the detecting resistor Rd are coupled to each other in parallel. Based on the circuit shown in FIG. 4A, the processing unit 162 may obtain an equation of the unknown leakage voltage Vlk and the leakage resistance Rlk to ground according to the cross voltage Vd (i.e., the first voltage value) of the detecting resistor Rd. The operation of the insulation detecting circuit 160 is similar to the operation previously described with reference to FIG. 3A.

Further, as shown in FIG. 4B, when the switching unit S1 is off and the switching unit S2 is also off, the first terminal of the resistor R1 is electrically coupled to the positive terminal of the DC input voltage Vin1, the second terminal of the resistor R1 is electrically coupled to the first terminal of the resistor R2, the second terminal of the resistor R2 is electrically coupled to the first terminal of the detecting resistor Rd, and the second terminal of the detecting resistor Rd is electrically coupled to the negative terminal of the DC input voltage Vin1. Based on the circuit shown in FIG. 4B, the processing unit 162 may obtain another equation of the unknown leakage voltage Vlk and the leakage resistance Rlk to ground according to the cross voltage Vd (i.e., the third voltage value) of the detecting resistor Rd.

Since the parameters of the resistors R1, R2 and the detecting resistor Rd are already known, and the DC input voltage Vin1 may be obtained by voltage detecting elements, the processing unit 162 may perform calculations using two equations to solve the unknown leakage voltage Vlk and the leakage resistor Rlk. Therefore, the insulation detecting circuit 160 may detect the insulation impedance value by the operation of turning on/off the switching unit S1.

It is noted that, for the circuit illustrated in FIG. 3B and the circuit illustrated in FIG. 4B, the equation of the leakage voltage Vlk and the leakage resistance Rlk to ground are different, and the processing unit 162 may adjust the calculation and parameters based on different modes, in order to perform the calculation of the insulation impedance value with the corresponding mode.

It is noted that, compared to the first mode shown in FIG. 3B, in the second mode shown in FIG. 4B, the cross voltage Vd of the detecting resistor Rd is determined by the DC input voltage Vin1, the resistor R1, the resistor R2, and the leakage voltage Vlk and the leakage resistor Rlk of the foreign object 400, since both the switching unit S1 and the switching unit S2 are off. Therefore, in the second mode, the processing unit 162 only controls the one switching unit S1 to be on or off, and does not need to switch both of the switching units S1 and S2, so a faster response speed and lower power loss may be achieved.

Alternatively stated, in the first mode, the insulation detecting circuit 160 has a relatively high accuracy. On the other hand, in the second mode, the insulation detecting circuit 160 saves energy and is associated with a more instantaneous detecting speed. In some embodiments, the processing unit 162 may be configured to receive a mode-selecting signal, and configure the insulation detecting signal 160 to operate in the first mode or the second mode according to the mode-selecting signal, so as to respond to different requirements of detecting speed or accuracy in different operation environments.

In some embodiments, the insulation detecting circuit 160 may be in the second mode during normal operation to detect and calculate the insulation impedance value of the power converting device 100. When the insulation impedance value calculated by the insulation detecting circuit 160 in the second mode is smaller than a predetermined impedance value, the insulation detecting circuit 160 may be configured to the first mode automatically and calculate the insulation impedance value again, with the processing unit 162 controlling the switching units S1 and S2 to be on or off. In some other embodiments, when the difference between the first voltage value and the third voltage value detected in the second mode by switching the switching unit S1 is smaller than a predetermined voltage value, the insulation detecting circuit 160 may also skip the procedure of insulation impedance value calculation and configure to the first mode automatically, and further control the switching units S1 and S2 to be on or off by the processing unit 162 to detect the first voltage value and the second voltage value and accordingly calculate the insulation impedance value again.

Thus, when the insulation detecting circuit 160 detects an abnormal insulation impedance value or the insulation impedance value is unable to be detected in the second mode, the insulation impedance value may be confirmed again in the first mode with a higher accuracy, so as to avoid faulty operation of the insulation detecting circuit 160.

When in the first mode, the insulation detecting circuit 160 re-confirms that the insulation impedance value is smaller than the safety limit value, the insulation detecting circuit 160 may notify the user of the abnormal insulation impedance value via the warning signal, or stop the operation of the power converting device 100 by the warning signal so as to prevent device damage or prevent an accident from occurring.

Thus, under normal circumstances with good isolation, the isolation detecting circuit 160 is not required to switch two of the switching units S1 and S2 at the same time, and thus the overall power loss of the power converting device 100 is reduced. In addition, when there is some concern that an insulation failure is detected, the insulation detecting circuit 160 is configured to the first mode having a high accuracy, and increases the voltage level detected by the processing unit 162 by turning on the switching unit S2 to bypass the resistor R1, so as to increase the accuracy of detection correspondingly and avoid detection and calculation errors due to voltage fluctuation or signal error.

It is noted that the insulation detecting circuit 160 may be realized in various ways, and the circuit shown in FIG. 2 is merely one of the possible ways to achieve the insulation detecting circuit 160 and not meant to limit the present disclosure. For example, in some embodiments, the resistors R1, R2 and the detecting resistor Rd may be electrically coupled in different relationships compared to the embodiments shown in FIG. 2. One skilled in the art can derive corresponding two equations of the leakage voltage Vlk and the leakage resistance Rlk to ground based on electric network analysis of fundamental circuitry, so as to design the corresponding processing unit 162 to perform the calculations to solve the unknown leakage voltage Vlk and the leakage resistance Rlk.

Figure 5:
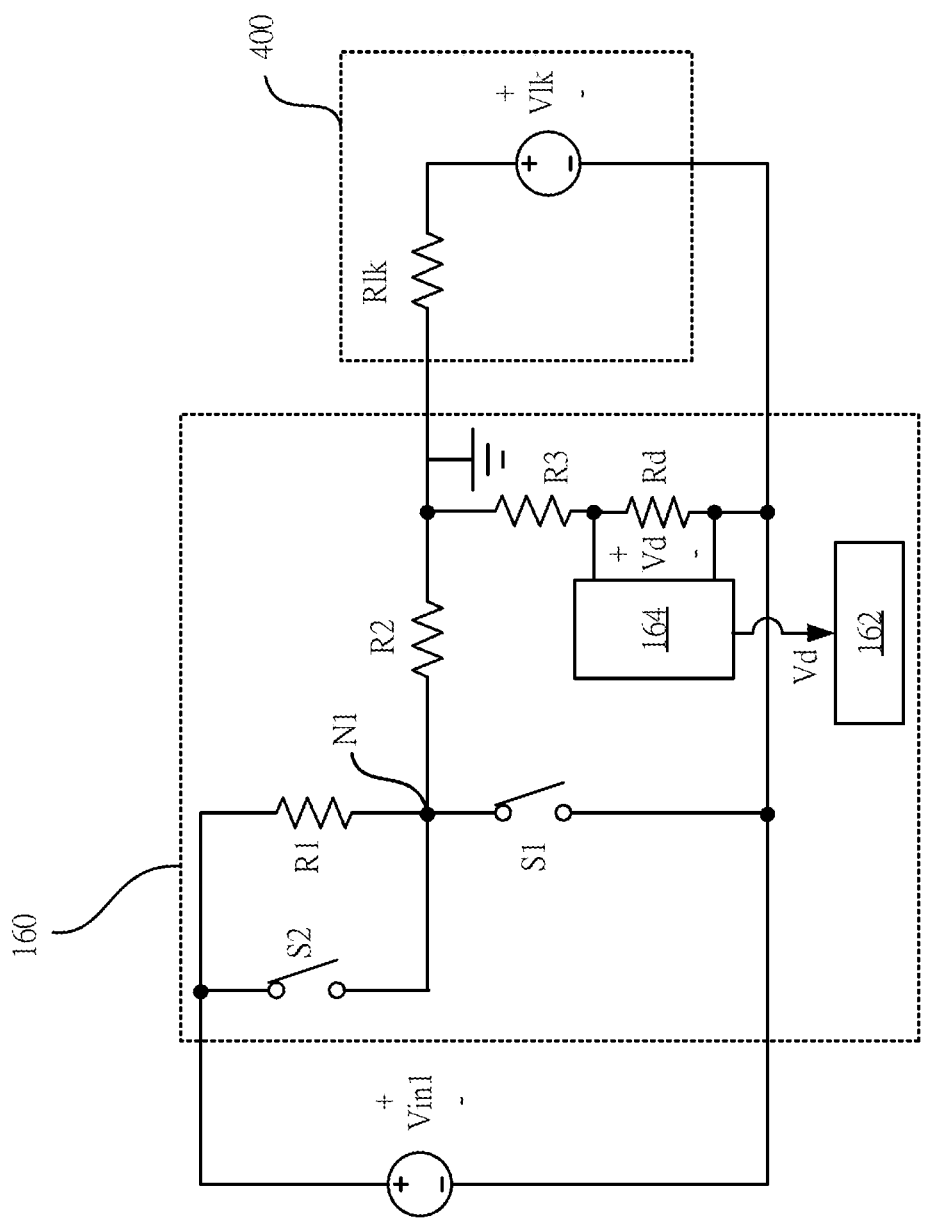
FIG. 5 is a diagram illustrating an insulation detecting circuit according to some other embodiments of the present disclosure.

Referring to FIG. 5, in some embodiments, the insulation detecting circuit 160 further includes a resistor R3. The resistor R3 is electrically coupled between the ground terminal and the detecting resistor Rd. Specifically, in order to avoid the voltage signal received by the processing unit 162 from being too large and damaging the elements, the resistor R3 is arranged and the impedance of the resistor R3 is designed for voltage-division, such that the cross voltage Vd between two terminals of the detecting resistor Rd is maintained within the preferred voltage region to protect the processing unit 162. Similarly, the circuit shown in FIG. 5 is also one example of a possible implementation of the insulation detecting circuit 160 and not meant to limit the present disclosure.

Figure 6:
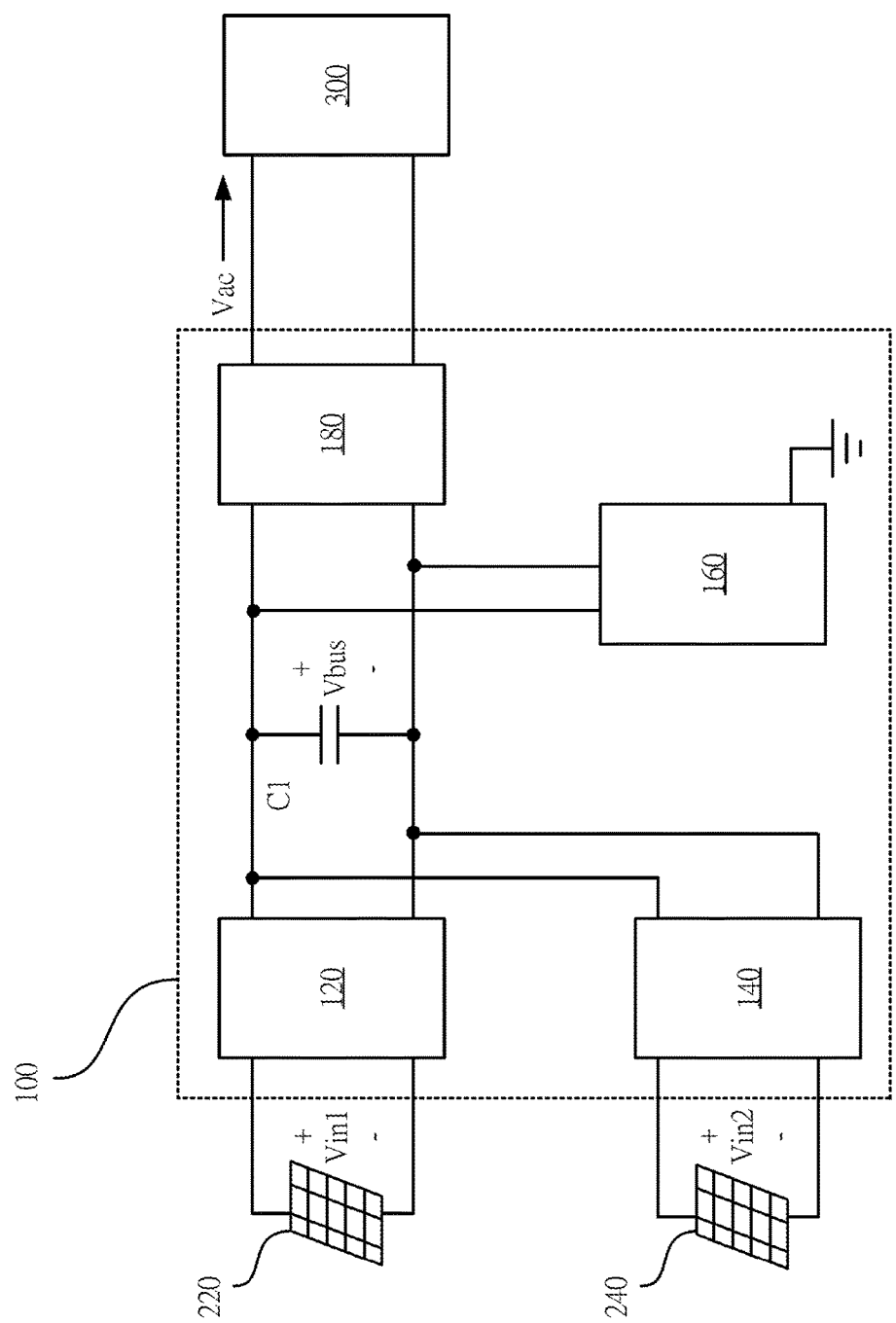
FIG. 6 is a diagram illustrating a power converting device according to some embodiments of the present disclosure.

Referring to FIG. 6, in some embodiments, the power converting device 100 may include two or more dc-dc converting circuits 120, 140. Specifically, the two input terminals of the power converting device 100 are electrically coupled to the solar PV power generating modules 220, 240 respectively, and configured to receive the DC input voltages Vin1, Vin2 provided by solar PV power generating modules 220, 240 and convert the DC input voltages Vin1, Vin2 to the AC voltage Vac. The dc-dc converting circuits 120, 140 correspond to the solar PV power generating modules 220, 240 respectively, and are configured to convert the DC input voltages Vin1, Vin2 to the DC bus voltage Vbus.

In the embodiment shown in FIG. 1, the insulation detecting circuit 160 is electrically coupled to the input side of the dc-dc converting circuit 120 and configured to receive the DC input voltage Vin1 so as to obtain the first voltage value and the second voltage value according to the DC input voltage Vin1. Alternatively, shown in the embodiment of FIG. 6, the insulation detecting circuit 160 is electrically coupled to the output side of the dc-dc converting circuits 120, 140 and between the dc-dc converting circuits 120, 140 and the dc-ac converting circuit 180, and configured to receive the DC bus voltage Vbus, so as to obtain the first voltage value and the second voltage value according to the DC bus voltage Vbus.

Figure 7:
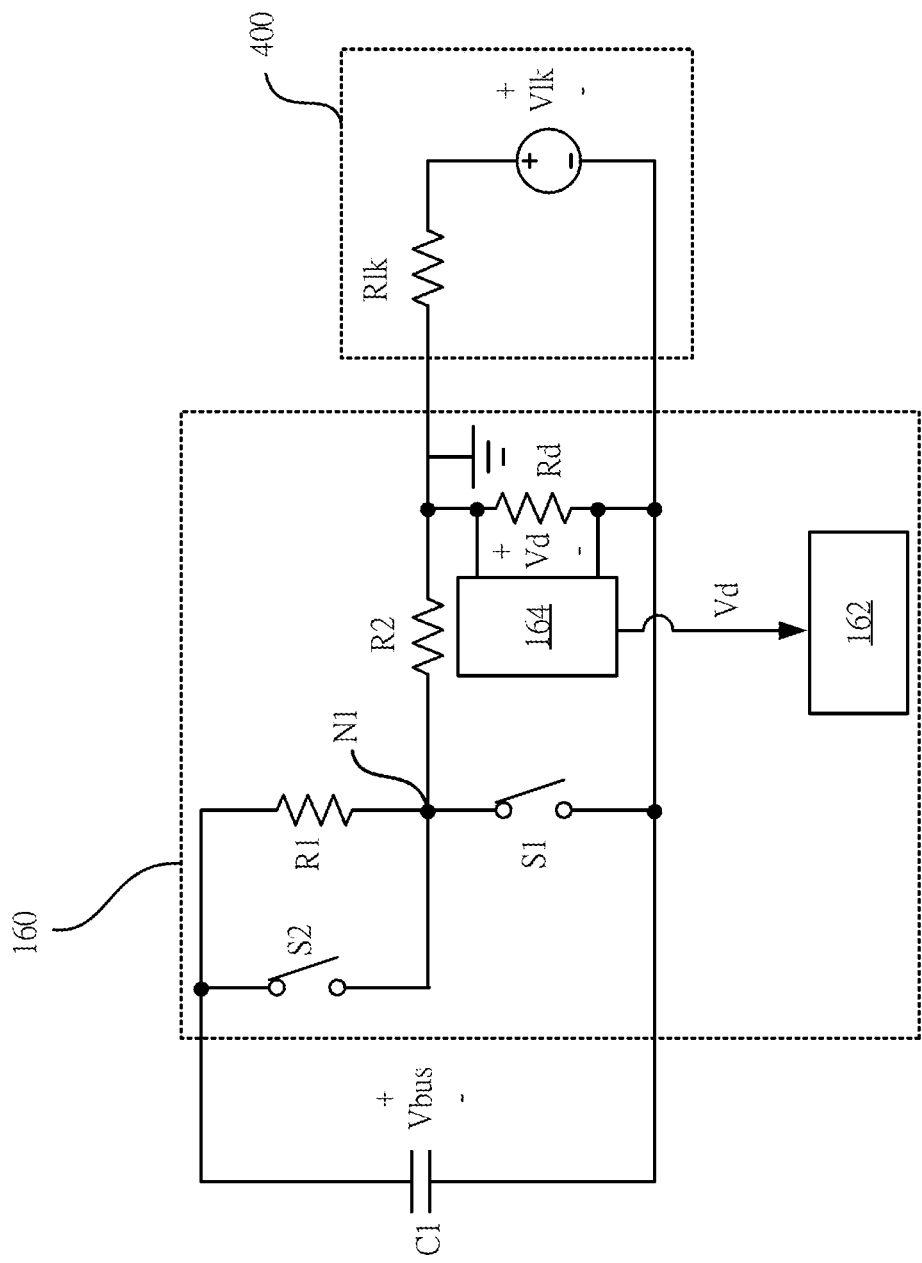
FIG. 7 is a diagram illustrating an insulation detecting circuit according to some embodiments of the present disclosure.

Referring to FIG. 7, in some embodiments, the insulation detecting circuit 160 includes the processing unit 162, the resistors R1, R2, the detecting resistor Rd, and the switching units S1 and S2. In the present embodiment, the first terminal of the resistor R1 and the first terminal of the switching unit S2 are electrically coupled to the positive power line (i.e., the first terminal of the capacitor unit C1), which is the positive terminal of the DC bus voltage Vbus. The second terminal of the switching unit S1 is electrically coupled to the negative power line (i.e., the second terminal of the capacitor unit C1), which is the negative terminal of the DC bus voltage Vbus. The detecting resistor Rd is electrically coupled between the ground terminal and the negative terminal (i.e., the second terminal of the capacitor unit C1) of the DC bus voltage Vbus. In the present embodiment, the operational details related to the detection and calculation performed by the insulation detecting circuit 160 are similar to those shown in the insulation detecting circuit 160 illustrated in FIG. 2 and thus are not further elaborated herein for the sake of brevity.

Alternatively stated, in the embodiments shown in FIG. 6 and FIG. 7, the insulation detecting circuit 160 in the power converting device 100 may also be arranged between the dc-dc converting circuits 120, 140 and the dc-ac converting circuit 180. Thus, even if the power converting device 100 includes multiple inputs and multiple sets of the corresponding dc-dc converting circuits 120, 140, an implementation may be that only one insulation detecting circuit 160 is required to detect the insulation impedance value, and there is no need to arrange multiple insulation detecting circuits 160 for each of the inputs. Therefore, the arrangement cost and the circuit area of the power converting device 100 may be reduced.

Further, since the insulation detecting circuit 160 detects the insulation impedance value of the power converting device 100 according to the DC bus voltage Vbus which is boosted to a high voltage level, the insulation detecting circuit 160 may still detect the insulation impedance value of the power converting device 100 accurately even if the voltage levels of the dc input voltages Vin1, Vin2 are low (such as, a result of a poor power generating ability during, for example, early morning hours, or at sunset, or in cloudy weather).

It is noted that, in the embodiments shown in FIG. 6 and FIG. 7, in the second mode, the processing unit 162 may also control the switching unit S1 to be on and the switching unit S2 to be off, in order to obtain the first voltage value across two terminals of the detecting resistor Rd according to the DC bus voltage Vbus, and control the switching unit S1 and the switching unit S2 to be off, in order to obtain the third voltage value across two terminals of the detecting resistor Rd according to the DC bus voltage Vbus. Accordingly, the processing unit 162 may be operated in the second mode to calculate the insulation impedance value of the power converting device 100 according to the first voltage value and the third voltage value.

It is noted that, although a full-bridge dc-ac converter may be applied to realize the dc-ac converting circuit 180 in the various embodiments described above, the present disclosure is not limited thereto. For example, in some other embodiments, the power converting device 100 may have a T-type neutral point clamped (TNPC) converter or other dc-ac converters to realize the dc-ac converting circuit 180.

The processing unit 162 may be implemented in various ways, such as by using a micro controller unit (MCU), a Complex Programmable Logic Device (CPLD), a Field-programmable gate array (FPGA), etc. The resistors R1, R2, R3, and the detecting resistor Rd, the switching units S1 and S2 and the capacitor unit C1 may also be implemented using suitable power electronic components.

The elements in the above embodiments may be implemented using various digital or analog circuits, and may also be implemented using different integrated circuit chips. Each element may also be integrated in a single digital control chip. The processing circuit may also be realized by various processors or other integrated circuit chips. The above list is merely exemplary and is not meant to be limitations of the present disclosure.

Figure 8:
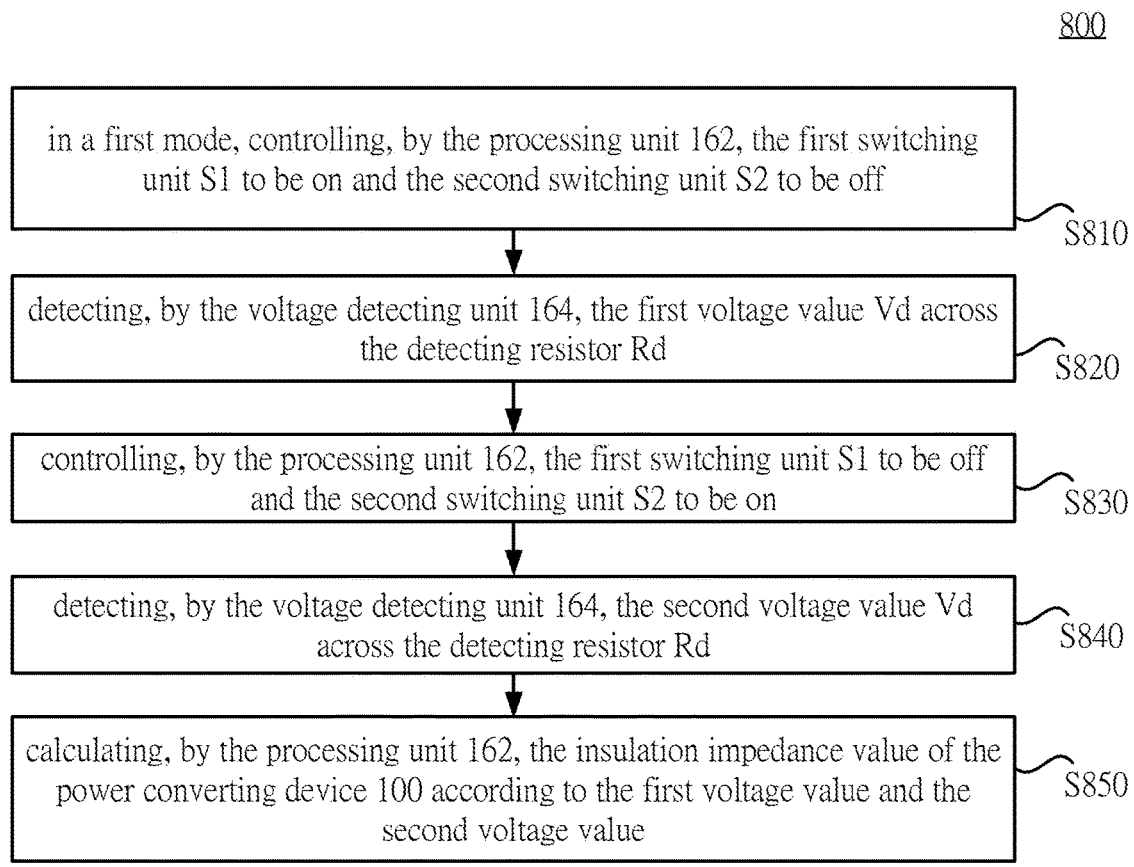
FIG. 8 is a flowchart diagram illustrating an insulation impedance value detecting method according to some embodiments of the present disclosure.
Figure 9:
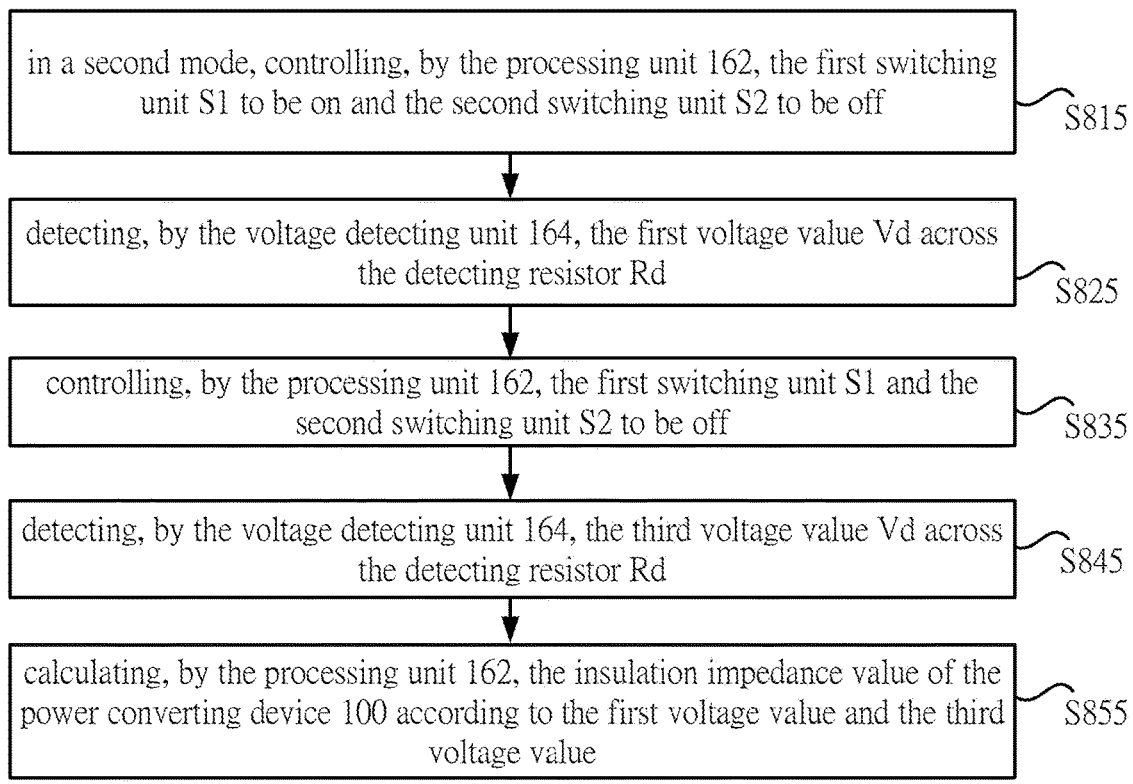
FIG. 9 is a flowchart diagram illustrating an insulation impedance value detecting method according to some other embodiments of the present disclosure.
Figure 10:
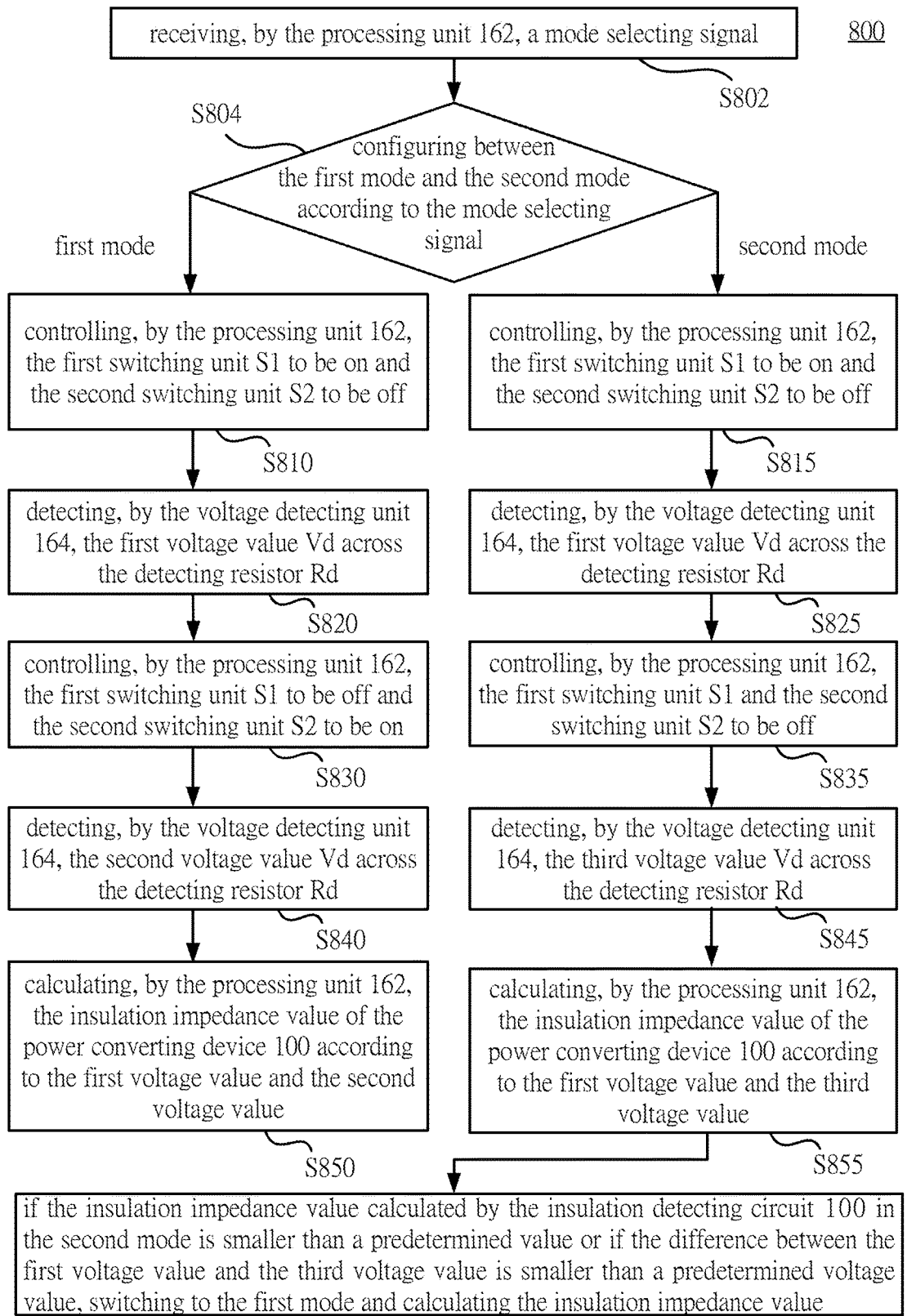
FIG. 10 is a flowchart diagram illustrating an insulation impedance value detecting method according to some other embodiments of the present disclosure.

Reference is made to FIG. 8 to FIG. 10. In some embodiments, the insulation impedance value detecting method 800 may be used in the power converting device 100. For better understanding of the present disclosure, the insulation impedance value detecting method 800 is discussed in relation to the embodiments shown in FIG. 1 to FIG. 7, but is not limited thereto. Those skilled in the art may make modifications and variations without departing from the scope or spirit of the disclosure. As shown in FIG. 8, the insulation impedance value detecting method 800 includes steps S810, S820, S830, S840 and S850.

Referring to FIG. 8, in step S810, in the first mode, the processing unit 162 controls the switching unit S1 is to be on and the switching unit S2 is to be off. Next, in step S820, the first voltage value Vd across the detecting resistor Rd is detected by the voltage detecting unit 164.

Next, in step S830, the processing unit 162 controls the switching unit S1 to be off and the switching unit S2 is to be on. Next, in step S840, the second voltage value Vd across the detecting resistor Rd is detected by the voltage detecting unit 164. In step S850, the insulation impedance value of the power converting device 100 is calculated by the processing unit 162 according to the first voltage value and the second voltage value.

In some embodiments, the insulation impedance value detecting method 800 further includes calculating the insulation impedance value in the second mode different from the first mode. Referring to FIG. 9, the insulation impedance value detecting method 800 further includes steps S815, S825, S835, S845 and S855. In step S815, in the second mode, the processing unit 162 controls the switching unit S1 to be on and the switching unit S2 to be off. Next, in step S825, the voltage detecting unit 164 detects the first voltage value across the detecting resistor Rd. Next, in step S835, the processing unit 162 controls the switching unit S1 and the switching unit S2 to be off. Next, in step S845, the voltage detecting unit 164 detects the third voltage value across the detecting resistor Rd. Next, in S855, the processing unit 162 calculates the insulation impedance value of the power converting device 100 according to the first voltage value and the third voltage value.

In some embodiments, the insulation impedance value detecting method 800 further includes switching between the first mode and the second mode. Referring to FIG. 10, the insulation impedance value detecting method 800 further includes steps S802 and S804. In step S802, the processing unit 162 receives the mode selecting signal. Next, in step S804, the processing unit 162 is configured between the first mode and the second mode according to the mode selecting signal. Further, in some other embodiments, the insulation impedance value detecting method 800 includes step S860. In step S860, the processing unit 162 is configured to switch to the first mode and calculate the insulation impedance value again, if the insulation impedance value calculated by the insulation detecting circuit 160 in the second mode is smaller than a predetermined impedance value. In some other embodiments, in step S860 the processing unit 162 is configured to switch to the first mode and calculate the insulation impedance value again, if the difference between the first voltage value and the third voltage value detected in the second mode is smaller than a predetermined voltage value.

In summary, in the present disclosure, according to the above embodiments, the two switching units S1 and S2 are used for switching in order to detect the insulation impedance value of the power converting circuit 100, which increases the accuracy of the detection of the insulation impedance value. Further, in some embodiments, by switching the insulation detecting circuit 160 in different modes to detect the insulation impedance value, the response speed during normal operation may be increased, and the power loss may be reduced.

What is claimed is:

1. An insulation detecting circuit, comprising:
a first switching unit;
a second switching unit electrically coupled to the first switching unit;
a detecting resistor;
a processing unit configured to control the first switching unit and the second switching unit; and
a voltage detecting unit configured to obtain a first voltage value across the detecting resistor when the processing unit controls the first switching unit to be on and the second switching unit to be off, wherein
the voltage detecting unit is further configured to obtain a second voltage value across the detecting resistor when the processing unit controls the first switching unit to be off and the second switching unit to be on, and wherein
the processing unit is further configured to operate in a first mode and calculate an insulation impedance value of a power converting device according to the first voltage value and the second voltage value.

2. The insulation detecting circuit of claim 1, further comprising:
a first resistor electrically coupled in parallel to the second switching unit.

3. The insulation detecting circuit of claim 1, wherein the first switching unit and the second switching unit are electrically coupled at a node, and the insulation detecting circuit further comprises:
a second resistor electrically coupled between the detecting resistor and the node.

4. The insulation detecting circuit of claim 3, further comprising:
a third resistor, wherein a first terminal of the third resistor is electrically coupled to the second resistor, and a second terminal of the third resistor is electrically coupled to the detecting resistor.

5. The insulation detecting circuit of claim 1, further comprising:
a first resistor, wherein a first terminal of the first resistor is electrically coupled to a first terminal of the second switching unit, and a second terminal of the first resistor is electrically coupled to a second terminal of the second switching unit; and
a second resistor, wherein a first terminal of the second resistor is electrically coupled to the second terminal of the first resistor, and a second terminal of the second resistor is electrically coupled to a first terminal of the detecting resistor;
wherein a first terminal of the first switching unit is electrically coupled to the first terminal of the second resistor, and a second terminal of the first switching unit is electrically coupled to a second terminal of the detecting resistor.

6. The insulation detecting circuit of claim 1, wherein the voltage detecting unit is further configured to obtain a third voltage value across the detecting resistor when the processing unit controls the first switching unit to be off and the second switching unit to be off, and wherein
the processing unit is further configured to operate in a second mode and calculate the insulation impedance value of the power converting device according to the first voltage value and the third voltage value.

7. The insulation detecting circuit of claim 6, configured to operate the processing unit in the first mode to calculate the insulation impedance value, if:

the processing unit operating in the second mode calculates the insulation impedance value to be smaller than a predetermined impedance value; or
the processing unit operating in the second mode calculates a difference between the first voltage value and the third voltage value to be smaller than a predetermined voltage value.

8. The insulation detecting circuit of claim 6, wherein the processing unit is further configured to receive a mode selecting signal and operate in the first mode or the second mode according to the mode selecting signal.

9. A power converting device, comprising:
a dc-dc converting circuit configured to convert a dc input voltage to a dc bus voltage;
a dc-ac converting circuit electrically coupled to the dc-dc converting circuit and configured to convert the dc bus voltage to an ac voltage; and
an insulation detecting circuit electrically coupled to the dc-dc converting circuit, the insulation detecting circuit comprising:
a first switching unit;
a second switching unit electrically coupled to the first switching unit;
a detecting resistor;
a processing unit configured to control the first switching unit and the second switching unit; and
a voltage detecting unit configured to obtain a first voltage value across the detecting resistor when the processing unit controls the first switching unit to be on and the second switching unit to be off, wherein
the voltage detecting unit is further configured to obtain a second voltage value across the detecting resistor when the processing unit controls the first switching unit to be off and the second switching unit to be on, and wherein
the processing unit is further configured to operate in a first mode and calculate an insulation impedance value of the power converting device according to the first voltage value and the second voltage value.

10. The power converting device of claim 9, wherein the insulation detecting circuit is electrically coupled to an input side of the dc-dc converting circuit and configured to receive the dc input voltage, so as to obtain the first voltage value and the second voltage value according to the dc input voltage.

11. The power converting device of claim 10, wherein the voltage detecting unit is further configured to obtain a third voltage value across the detecting resistor when the processing unit controls the first switching unit to be off and the second switching unit to be off, and wherein
the processing unit is further configured to operate in a second mode and calculate the insulation impedance value of the power converting device according to the first voltage value and the third voltage value.

12. The power converting device of claim 9, wherein the insulation detecting circuit is electrically coupled to an output side of the dc-dc converting circuit and electrically coupled between the dc-dc converting circuit and the dc-ac converting circuit, and configured to receive the dc bus voltage, so as to obtain the first voltage value and the second voltage value according to the dc bus voltage.

13. The power converting device of claim 12, wherein the voltage detecting unit is further configured to obtain a third voltage value across the detecting resistor when the processing unit controls the first switching unit to be off and the second switching unit to be off, and wherein the processing unit is further configured to operate in a second mode and calculate the insulation impedance value of the power converting device according to the first voltage value and the third voltage value.

14. The power converting device of claim 9, further comprising a capacitor unit, wherein the dc bus voltage is transmitted from the dc-dc converting circuit to the dc-ac converting circuit via a positive power line and a negative power line, and wherein a first terminal of the capacitor unit is electrically coupled to the positive power line and a second terminal of the capacitor unit is electrically coupled to the negative power line.

15. The power converting device of claim 14, wherein a first terminal of the second switching unit is electrically coupled to the positive power line; a second terminal of the second switching unit is electrically coupled to a first terminal of the first switching unit; and a second terminal of the first switching unit is electrically coupled to the negative power line.

16. The power converting device of claim 14, wherein the insulation detecting circuit further comprises:
 a first resistor, wherein a first terminal of the first resistor is electrically coupled to the positive power line and a first terminal of the second switching unit, and a second terminal of the first resistor is electrically coupled to a second terminal of the second switching unit; and
 a second resistor, wherein a first terminal of the second resistor is electrically coupled to the second terminal of the first resistor, and a second terminal of the second resistor is electrically coupled to a first terminal of the detecting resistor;
 wherein a first terminal of the first switching unit is electrically coupled to the first terminal of the second resistor, and a second terminal of the first switching unit is electrically coupled to the negative power line and a second terminal of the detecting resistor.

17. An insulation impedance value detecting method, comprising:
 in a first mode, controlling, by a processing unit, a first switching unit to be on and a second switching unit to be off;
 detecting, by a voltage detecting unit, a first voltage value across a detecting resistor;
 controlling, by the processing unit, the first switching unit to be off and the second switching unit to be on;
 detecting, by the voltage detecting unit, a second voltage value across the detecting resistor; and
 calculating, by the processing unit, an insulation impedance value of a power converting device according to the first voltage value and the second voltage value.

18. The insulation impedance value detecting method of claim 17, further comprising:
 in a second mode, controlling, by the processing unit, the first switching unit to be on and the second switching unit to be off;
 detecting, by the voltage detecting unit, the first voltage value across the detecting resistor;
 controlling, by the processing unit, the first switching unit and the second switching unit to be off;
 detecting, by the voltage detecting unit, a third voltage value across the detecting resistor; and
 calculating, by the processing unit, the insulation impedance value of the power converting device according to the first voltage value and the third voltage value.

19. The insulation impedance value detecting method of claim 18, further comprising:
 if the insulation impedance value calculated by the insulation detecting circuit in the second mode is smaller than a predetermined value; or
 if the difference between the first voltage value and the third voltage value is smaller than a predetermined voltage value,
 switching to the first mode and calculating the insulation impedance value.

20. The insulation impedance value detecting method of claim 18, further comprising:
 receiving, by the processing unit, a mode selecting signal; and
 configuring between the first mode and the second mode according to the mode selecting signal.

* * * * *